United States Patent [19]
Yakymyshyn et al.

[11] Patent Number: 6,016,053
[45] Date of Patent: Jan. 18, 2000

[54] GAS-INSULATED SWITCHGEAR WITH VOLTAGE TRANSFORMER AND OPTICAL MEASURING ELEMENT

[75] Inventors: Christopher Yakymyshyn, Bozeman, Mont.; Michael Brubaker, Los Alamos, N. Mex.; Michael Schwarz, Freigericht, Germany; Alexis Mendez, Raleigh, N.C.; Dirk Ebbinghaus, Luenen, Germany

[73] Assignee: ABB Patent GmbH, Mannheim, Germany

[21] Appl. No.: 08/918,365

[22] Filed: Aug. 26, 1997

[30] Foreign Application Priority Data

Aug. 26, 1996 [DE] Germany ............... 196 34 251

[51] Int. Cl.⁷ .......................... G01R 31/00; G01R 19/00; G01J 4/00
[52] U.S. Cl. .......................... 324/96; 324/126; 324/127; 356/364; 356/365
[58] Field of Search ............... 324/96, 126, 127, 324/244.1; 356/365, 366, 367, 364

[56] References Cited

U.S. PATENT DOCUMENTS

| | | | |
|---|---|---|---|
| 3,363,174 | 1/1968 | Hudson et al. | 324/96 |
| 3,680,071 | 7/1972 | Burgoon | 340/248 R |
| 3,939,412 | 2/1976 | Hermstein et al. | 324/96 |
| 4,933,629 | 6/1990 | Kozuka et al. | 324/96 |
| 4,999,571 | 3/1991 | Ishiko et al. | 324/96 |
| 5,128,608 | 7/1992 | Ochi | 324/96 |
| 5,153,427 | 10/1992 | Takahashi et al. | 324/96 |
| 5,578,805 | 11/1996 | Berger et al. | 218/43 |
| 5,703,491 | 12/1997 | Nakamura et al. | 324/96 |
| 5,715,058 | 2/1998 | Bohnert et al. | 324/96 |

*Primary Examiner*—Ernest Karlsen
*Assistant Examiner*—T. R. Sundaram
*Attorney, Agent, or Firm*—Herbert L. Lerner; Laurence A. Greenberg

[57] ABSTRACT

The voltage transformer has a measuring element in the electrical field between an internal conductor and an external conductor of a metal-encapsulated, gas-insulated switchgear. The measuring element includes a Pockels crystal, a crystal of transparent material which, under the influence of the electric field, influences polarized light that is radiated through on account of the Pockels effect. The Pockels crystal has two parallel walls transverse with respect to the field lines. A first deflection prism, which deflects a light beam through 180°, is disposed on the crystal face at the high-voltage end. Several optical elements are disposed at the face on the low-voltage side. The optical elements include a light input coupler for polarized light and two light output couplers. The reflected light beam impinges on a beam splitter, which splits the light beam into two partial beams. The first partial beam radiates firstly through a quarter-wave plate and then through a first analyzer. The second partial beam radiates through a second analyzer.

8 Claims, 3 Drawing Sheets

GAS-INSULATED SWITCHGEAR WITH VOLTAGE TRANSFORMER AND OPTICAL MEASURING ELEMENT

BACKGROUND OF THE INVENTION

1. Field of the Invention

The invention pertains to a voltage transformer with a measuring element disposed in the electric field between an internal conductor and an external conductor of a metal-encapsulated, preferably gas-insulated switchgear and which is made of a clearly transparent crystal material which, under the influence of the electric field, influences polarized light that is radiated through on account of the so-called Pockels effect.

2. Description of the Related Art

Voltage transformers in which a crystal exhibiting the Pockels effect (an electro-optical effect) is utilized have been disclosed, for example, in the publication DE-B Schwab, Hoch-spannungstechnik [High-voltage technology], 2d Ed., Springer Verlag, page 176 et seq., in particular 177–179, 181–184. In contrast to so-called conventional voltage transformers, voltage transformers which utilize the Pockels effect can measure high-frequency field or voltage changes. In that context, potential isolation is provided; instances of ferroresonance do not occur and the system is insensitive to electromagnetic interference. A voltage transformer in which the Pockels effect is utilized has become known from European patent publication EP 0 410 234 B1, for example. The crystal used in that case is a quartz crystal and the light which is produced by a light source and polarized by a polarizer radiates through the quartz crystal in a direction running perpendicularly to the field lines of the electric field. On the output side, the light beam, which is influenced by the crystal, is split into two light beams with a beam splitter. The beams each pass through an analyser and are forwarded to a receiver through optical fibers.

Voltage transformers in which the Pockels effect or a similar effect is utilized have also been disclosed in U.S. Pat. No. 3,363,174. In that case, light radiates through a rod made of a crystal. The light beam radiates through the crystal in the direction of the field lines or parallel thereto, and a photocell is provided, which captures the light modulated by the rod-shaped crystal and processes it further. The system is designed as an outdoor voltage transformer and it is not suitable for $SF_6$-gas-insulated, metal-encapsulated switchgear.

A voltmeter of the type mentioned above has also been disclosed in the European patent publication EP 0 083 196 B1. In that case, use is made not only of crystals of KDP, ADP, $LiNbO_3$ and $LiTaO_3$, but also of crystals which are referred to as BGO (with a composition of $Bi_{12}GeO_{20}$). The crystal has two electrodes, which are transparent. The light beam runs in the direction of the electric field. The light beam is first of all directed through a polarizer, a quarter-wave plate, the crystal and through an analyser, and the light influenced by the analyser is processed further. The document describes the voltage transformer only in principle.

A further literature reference is the SUMITOMO ELECTRIC company journal, which describes a measuring device in which the crystal is arranged in a core which is placed around an electrical conductor. The crystal material is BSO.

SUMMARY OF THE INVENTION

It is accordingly an object of the invention to provide a voltage transformer, which overcomes the above-mentioned disadvantages of the heretofore-known devices of this general type and which can be readily used in metal-encapsulated, $SF_6$-gas-insulated switchgear.

With the foregoing and other objects in view there is provided, in accordance with the invention, a voltage transformer, comprising:

a measuring element disposed in an electric field between an internal conductor and an external conductor of a switchgear (preferably metal-encapsulated and $SF_6$-gas-insulated), the measuring element including a Pockels crystal having two parallel walls running transversely with respect to field lines of the electric field, a first deflection prism disposed on a first end face at a high-voltage end of the Pockels crystal, for deflecting a light beam through 180°, a light input coupler for polarized light and two light output couplers disposed on a second end face at a low-voltage end of the Pockels crystal;

a beam splitter disposed in a path of a light beam reflected from the first deflection prism for splitting the reflected light beam into a first partial beam and into a second partial beam;

a quarter-wave plate, a first analyzer, and a light output coupler disposed in a path of the first partial beam; and a second analyzer and a light output coupler disposed in a path of the second partial beam.

In other words, the objects of the invention are achieved with the transformer crystal that has two parallel walls running transversely with respect to the field lines; with the first deflection prism, which deflects the light beam through 180° at the high-voltage end face of the crystal; with a light input coupler for polarized light and two light output couplers at the ground potential end face. The reflected light beam traverses a beam splitter, which splits the light beam into two partial beams, one traversing a quarter-wave plate ($\lambda/4$-plate) and then a first analyzer and the other partial beam traversing a second analyzer. The use of a quarter-wave plate is disclosed in EP 0 083 196 B1, which is herein incorporated by reference; in that case, however, the quarter-wave plate is situated before the crystal, as seen in the propagation direction of the light beam.

In accordance with an added feature of the invention, the voltage transformer is fixed between an internal conductor and an arm fitted to the housing of the metal enclosure. As a result, the voltage transformer is at high-voltage potential at one end and at ground or earth potential at the other end.

In accordance with an additional feature of the invention, there are provided field line control devices at the ends of the crystal. This ensures that the electric field lines in the region of the crystal run exactly parallel to the light beams which permeate the crystal. The control devices may be shielding covers at the ends of the voltage transformer and, furthermore, a transparent, electrically conductive layer on the end walls of the crystal; this transparent, electrically conductive layer is used to align the field lines within the crystal parallel to the light beams and to avoid excessive field increases.

For protection, the elongate cylindrical crystal is accommodated in a tubular housing, which engages in a recess in the shielding covers and which is elastically damped therein with at least one flexible ring on the outer periphery of the tube.

At its high-voltage end, the crystal itself is inserted together with the deflection prism into a recess in a holding fitting, which is inserted at the bottom of the shielding cover at the high-voltage end, with the interposition of an elastic support. The tubular housing partially embraces the holding fitting on the outer periphery thereof. The voltage transformer is fastened to an internal conductor by means of the shielding cover at the high-voltage end.

In accordance with a further advantageous embodiment, the low-voltage or ground-potential end of the crystal is held in a further tube-like holding fitting. The outside of that fitting is likewise partially embraced by the tube. The tube with the holding fitting is mounted in the shielding cover at the low-voltage end, with the interposition of one or more elastic rings. The low-voltage end of the voltage transformer is fixed to the holding arm of the metal enclosure by means of the shielding cover.

The further holding fitting embraces and also protects the optical components such as the light input coupler, beam splitter, light output couplers, quarter-wave plate and polarizers and analyzers. It is then covered by a cap whose cylindrical wall embraces the further holding fitting on the outside.

In accordance with a concomitant feature of the invention, the covering cap has a filter, which keeps contamination of the insulating gas and moisture away from the interior of the voltage transformer.

Other features which are considered as characteristic for the invention are set forth in the appended claims.

Although the invention is illustrated and described herein as embodied in a voltage transformer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
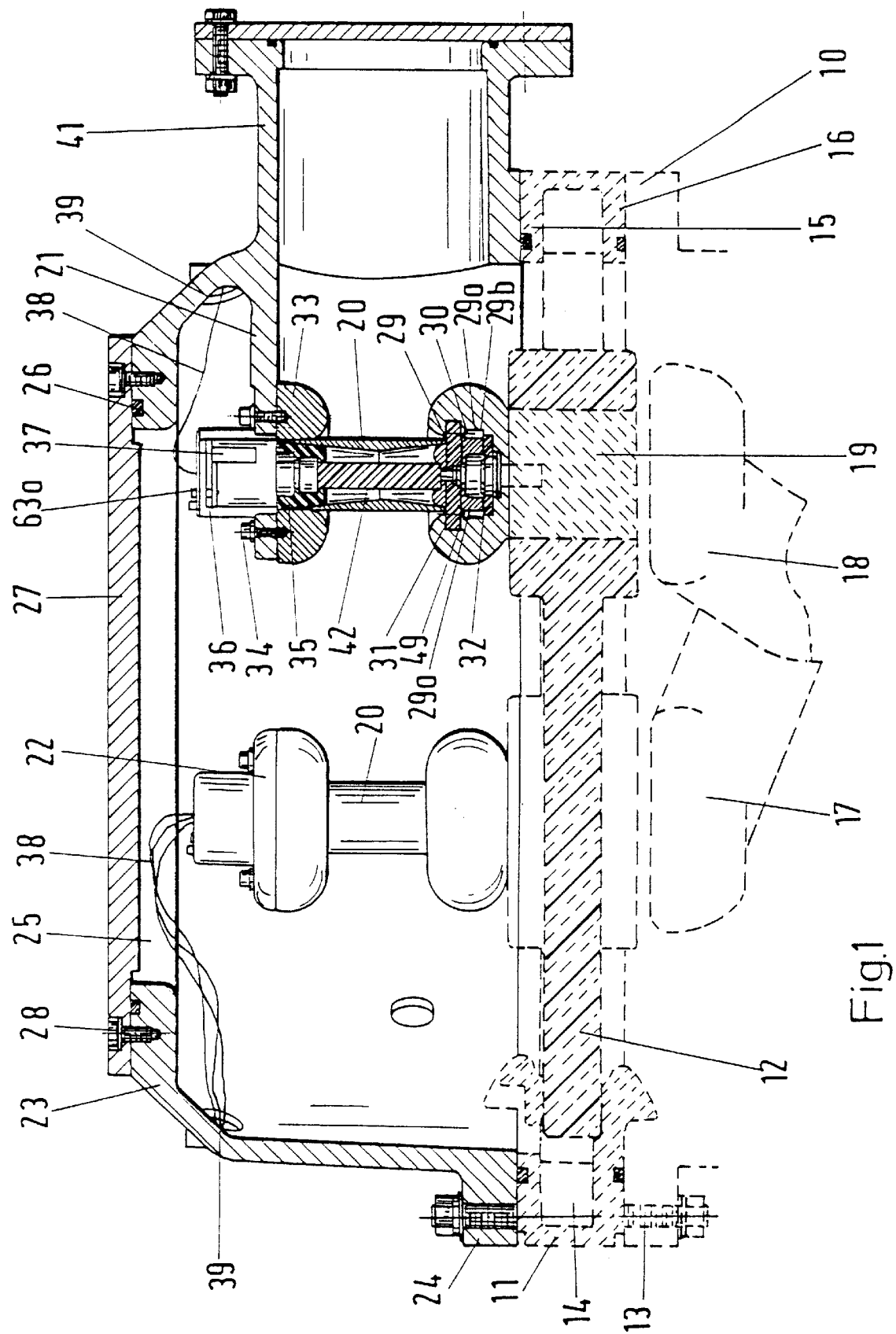
FIG. 1 is a sectional view taken through a voltage transformer in a switchgear.

Referring now to the figures of the drawing in detail and first, particularly, to FIG. 1 thereof, there is seen a retainer or insulator ring 11 for an insulator 12 which is fastened by a screw connection 13 to a flange 10 of a gas-insulated metal-encapsulated high-voltage switchgear. The cross-section of the retainer 11 has a U-shape with an open end directed inwardly and with legs 15, 16 firmly holding the insulator 12. The insulator 12 may be a partitioned insulator or just one insulator. The switchgear has internal conductors 17, 18, which are connected to bushings 19 (only one bushing is visible) in the insulator 12 in an electrically conductive manner on one side of the insulator 12 (at the bottom in the drawing).

One voltage transformer 20 for each phase is mounted on the other, top side of the insulator or of the bushing 19. The other end of the transformer 20 is fixed to a carrying arm 21 or 22 of a pot-shaped hood 23. The hood 23 is connected to the retainer 11 by means of a flange 24. On its side opposite to the flange 24, the pot-shaped hood 23 is provided with a mounting hole 25. The mounting hole 25 is closed off, with the interposition of a seal 26, by a cover 27. The cover 27 is screwed (screw connections 28) to the hood 23.

A pot-shaped shielding cover 29 is fastened on the bushing 19 by means of a screw connection 30. The high-voltage end of the voltage transformer 20 engages in the shielding cover 29 and is supported therein radially by means of rubber-elastic foam rings 31 and axially by means of a bearing ring 32, which is likewise composed of rubber-elastic foam material. The rings 31, 32 serve the purpose of damping and protection against vibratory movements.

A shielding cover 33 is likewise fastened, by means of screw connections 34, on that side of the holding arm 21 which faces the insulator 12. The low-voltage end of the voltage transformer 20 engages in the shielding cover 33 and it is likewise supported therein radially by rubber-elastic foam rings 35. The voltage transformer 20 penetrates the carrying arm 21 and is covered on the top side of the latter by means of a covering cap 36, which is fixed on the top side of the carrying arm 21 by the screw connections 34. A filter 37 is situated inside the voltage transformer 20 and is used to prevent decomposition products of the insulating gas and moisture from being able to penetrate into the interior of the voltage transformer 20.

Optical waveguides or optical fibers 38 are passed out of the voltage transformer. The optical waveguides pass through openings 39 with suitable bushings. Information in that regard is found in copending German patent application Ser. No. (attorney docket number Mp.-Nr. 96/644), the disclosure of which is herein incorporated by reference.

The covering hood 23 also has a connection stub 41, which has no significance for the invention.

The potential transfer to the transformer at the high-voltage end is effected through a contact spring 29a, which is seated in an internal groove 29b in the shielding cover 29 and which brings the shielding cover 29 into contact with the outer surface of a holding fitting 49 (see below), and at the ground end through a cable 63a, which is fastened on the covering cap 36 by a screw connection 34 (see below).

Figure 2:
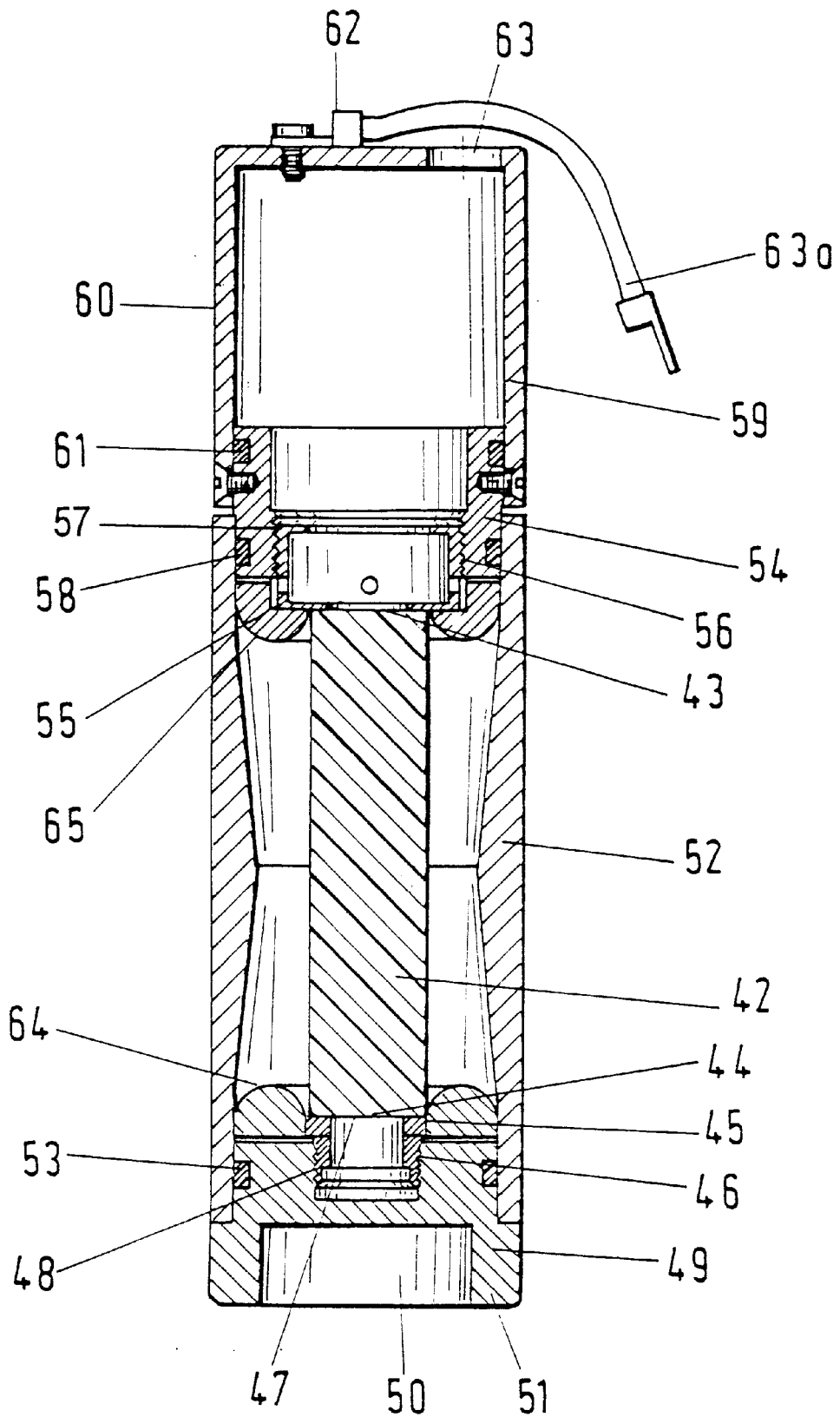
FIG. 2 is an enlarged sectional view of the voltage transformer.

Referring now more specifically to FIG. 2, the voltage transformer 20 has a crystal 42 as its main component. The crystal 42 is in the form of a bar, it is transparent and it is composed of a material which exhibits the Pockels effect. BGO may serve as such a material, for example. The end faces 43 (second end face at the low-voltage end) and 44 (first end face at the high-voltage end) are exactly parallel to one another and are coated with an electrically conductive material, which is likewise permeable to the polarized light, in order that the electric field lines in the region of the voltage transformer run parallel to the longitudinal extent of the crystal 42 or parallel to the course of the light beams.

At the high-voltage end, the crystal 42 is fixedly connected to an annular flange 45 of a sleeve 46 in which a V-shaped deflection prism 47 is accommodated. A light beam radiating through the crystal 42 from above is reflected upwards by the prism 47. The sleeve 46 is screwed into the internal thread 48 of a holding fitting 49, which, on its side facing the bushing, is formed with a recess 50. Due to the recess 50, an annular end face 51 is formed by which the armature 49 bears on the ring 32. The recess 50 partially accommodates the head of the screw 30 as well.

On its outer surface, the fitting 49 is partially surrounded by a tube 52. A seal 53 is disposed between the tube 52 and the fitting 49.

The other end of the crystal—the upper end in FIG. 2 which is the low-voltage end—is fixedly connected to a pot-shaped retainer 55, on the external bottom side of the latter. The retainer 55 has an external thread 56 which is screwed into an internal thread 57 of a further carrier fitting 54. The tube 52 likewise partially surrounds the outer surface of the fitting 54, with the interposition of a seal 58.

The end of the fitting 54 which is remote from the crystal 42 is partially surrounded by a covering cap 59 having a cylindrical wall 60, the external and internal diameters of which correspond to the external and internal diameters of the tube 52. In this case, too, a seal 61 is provided between the cylindrical wall 60 and the outer surface of the fitting 54.

An opening 63, in which the filter 37 is inserted, is situated in the covering cap bottom 62, located at the top. Optical elements are situated inside the covering cap 59 by means of which the light beam is routed to the crystal and the reflected light beam is captured, i.e., received.

The contours 64 and 65 of the fittings 49 and 54, respectively, which face one another are convexly rounded. The convex rounding favorably influences the course of the field lines at those locations.

Figure 3:
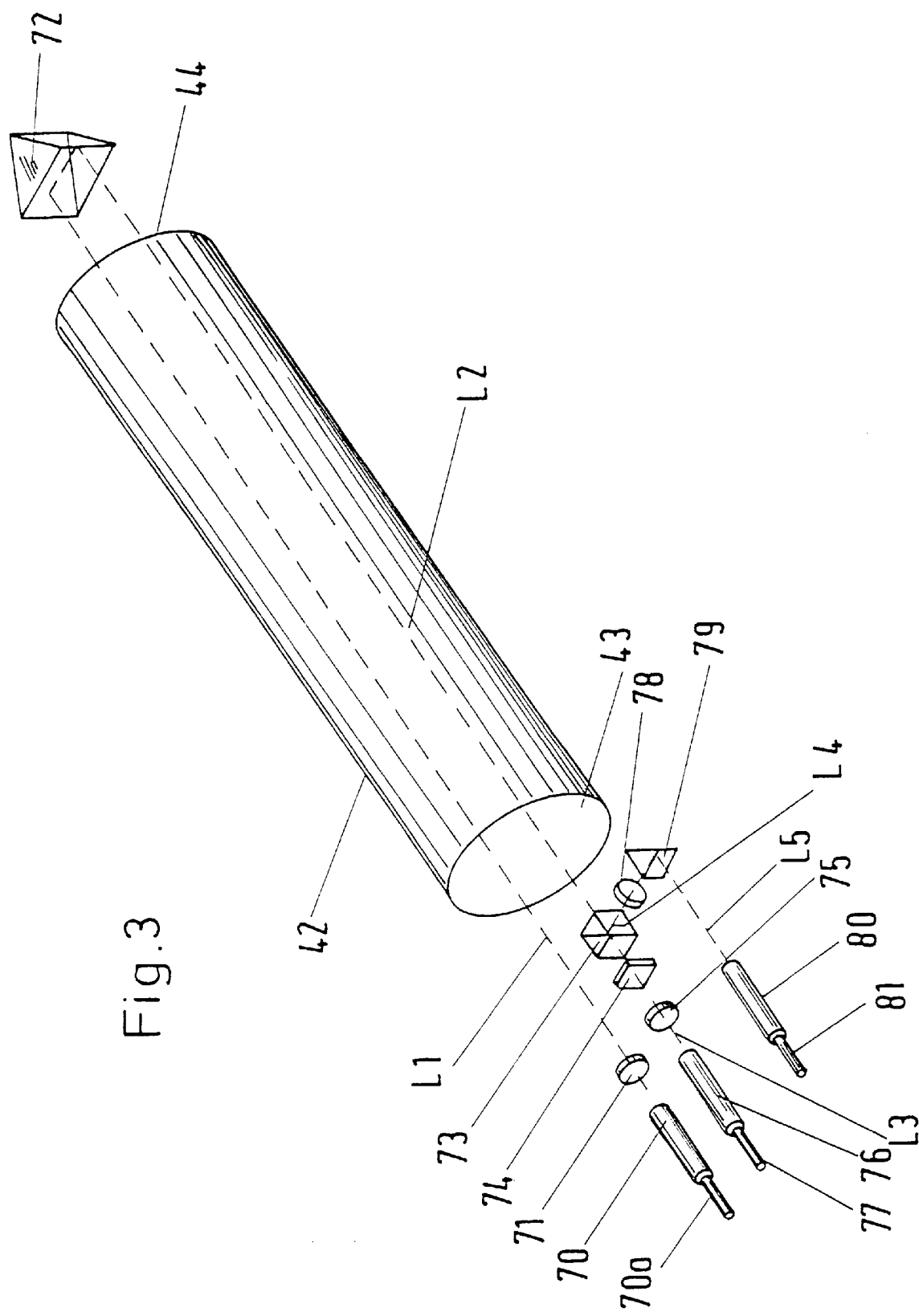
FIG. 3 is a perspective, exploded view of the crystal with optical elements.

The fundamental assignment of the optical elements to the crystal 42 is explained with the aid of the exploded view of FIG. 3. The crystal 42 is referred to as a Pockels crystal, because it subjects light traversing the crystal in the electrical field to the Pockels effect. A light beam L1 is routed via a lens system (light input coupler) 70 to the crystal 42, to be precise onto its upper (ground-potential-end), transparent and conductive face 43. A first polarizer 71 is disposed between the lens system 70 and the face 43. A deflection prism 72, which corresponds to the deflection prism 47 of FIG. 2, is arranged on the rear end face 44 of the crystal 42. The rear end face 44 is likewise a transparent, conductive face 44. The prism 72 deflects the light beam L1 into the light beam L2, which is in the opposite direction to the light beam L1. The light beam L2 impinges on a beam splitter 73, by which it is split into partial light beams L3 and L4. The partial light beam L3 initially passes, downstream of the beam splitter 73, through a quarter-wave plate 74 and then through an analyser 75, and the light beam L3 is received by a first optical lens system (light output coupler) 76 and forwarded via an optical waveguide 77. The partial beam L4 initially radiates through a second analyser 78 and then impinges on a deflection prism 79, and the parallel light beam L5 which is deflected as a result is picked up by a second lens system (light output coupler) 80 and forwarded via an optical waveguide 81. The optical components 70, 71, 73–76, 78–80 are situated in the covering cap 59, from which the optical waveguides emerge outwards. The optical waveguide which routes the light to the lens system 70 is designated by 70a. The combination of optical waveguides 70a, 77 and 81 is designated overall by 38 in FIG. 1.

The individual components, the polarizer 71, the deflection prism 72, the beam splitter 73 plus the remaining components 74, 75, 78 and 79 are combined to form a unit and bonded on the surface 43 or 44. It goes without saying that, furthermore, the individual light beams L1, L2, L3, L4 and L5 are exactly focused with the required provisions.

A conductor 63a is screwed or electrically conductively fastened on the outer surface of the bottom 62 of the covering cap 59 made of metallic material. The other end of the conductor 63a is electrically conductively connected to the cap 36. The signals received by the light output couplers 76, 80 are routed to the outside via the optical waveguides 38 and undergo further processing in a non-illustrated evaluation device.

The invention can be used with particular advantage in high-voltage installations or switchgear in which the voltage potential is greater than 1 kV.

We claim:

1. A switchgear, comprising:
   a metal, gas insulated housing having a pot-shaped cap and a carrier arm;
   an internal conductor connected to said housing;
   a voltage transformer connected to said carrier arm and encapsulated by said housing, said voltage transformer having two ends and including:
      a measuring element disposed in an electric field having field lines between said internal conductor and said housing, said measuring element including a Pockels crystal, a first deflection prism, a light input coupler, and two light output couplers, said Pockels crystal having two parallel walls running transversely with respect to the field lines of the electric field, one of said two parallel walls defining a high-voltage end and the other of said two parallel walls defining a low-voltage end, said first deflection prism disposed on said high voltage end for deflecting a light beam through 180°, said light input coupler for polarized light and said two light output couplers disposed on said low-voltage end;
      a beam splitter disposed in a path of the light beam deflected from said first deflection prism for splitting the deflected light beam into a first partial beam and into a second partial beam;
      a quarter-wave plate, a first analyzer, and a light output coupler disposed in a path of the first partial beam;
      a second analyzer and a light output coupler disposed in a path of the second partial beam;
      two shielding covers, one of said shielding covers disposed on one of said ends of said voltage transformer and another shielding cover disposed on another of said ends of said voltage transformer;
      two transparent, electrically conductive layers for insuring that the field lines of the electric field run parallel to the light beam, one of said transparent, electrically conductive layers disposed on said high voltage end of said Pockels crystal, another one of said transparent, electrically conductive layers disposed on said low voltage end of said Pockels crystal;
      a tubular housing having said Pockels crystal disposed therein; and
      at least two flexible rings elastically supporting said tubular housing within said shielding covers.

2. The voltage transformer according to claim 1, wherein said Pockels crystal is an elongated cylindrical crystal, and said shielding covers each have a recess formed therein in which said tubular housing engages.

3. The voltage transformer according to claim 2, which further comprises a holding fitting holding said Pockels crystal at the high-voltage end thereof, said holding fitting being partially embraced on an outer periphery thereof by said tubular housing, and including a sealing element disposed between said outer periphery of said holding fitting and said housing.

4. The voltage transformer according to claim 2, which further comprises a first holding fitting holding said Pockels crystal at the high-voltage end thereof and a second holding fitting holding said Pockels crystal at the low-voltage end thereof, said first and second holding fittings being partially embraced by and sealed against said tubular housing.

5. The voltage transformer according to claim 2, which further comprises a tubular holding fitting holding said Pockels crystal at the low-voltage end thereof, said holding fitting being partially embraced by and sealed against said tubular housing.

6. The voltage transformer according to claim 5, which further comprises a plurality of optical components disposed in said tubular holding fitting, said optical components including said light input coupler, said beam splitter, said light output couplers, said a quarter-wave plate, said polarizers, and said analyzers.

7. The voltage transformer according to claim 6, wherein said optical components are fixedly connected to said Pockels crystal.

8. The voltage transformer according to claim 5, which further comprises a covering cap embracing said tubular holding fitting, said covering cap having a cylindrical wall covering an outside of said tubular holding fitting.

* * * * *